(12) United States Patent
König

(10) Patent No.: US 6,203,677 B1
(45) Date of Patent: *Mar. 20, 2001

(54) SPUTTERING DEVICE FOR COATING AN ESSENTIALLY FLAT DISK-SHAPED SUBSTRATE

(75) Inventor: Michael König, Frankfurt (DE)

(73) Assignee: Leybold Systems GmbH, Hanau, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,319

(22) Filed: Sep. 28, 1998

(30) Foreign Application Priority Data

Sep. 29, 1997 (DE) .............................. 197 42 923

(51) Int. Cl.[7] ...................................... C23C 14/34
(52) U.S. Cl. .................. 204/298.27; 204/298.23; 204/298.25; 204/298.28
(58) Field of Search ................. 204/298.23, 298.27, 204/298.28, 192.12, 298.15, 298.25; 118/730; 414/217, 222, 225

(56) References Cited

U.S. PATENT DOCUMENTS

| | | | |
|---|---|---|---|
| 3,874,525 | 4/1975 | Hassan et al. ................... 214/17 |
| 3,915,117 | 10/1975 | Schertler ........................ 118/49 |
| 4,266,208 | * 5/1981 | Nishida et al. ................. 118/730 |
| 4,548,699 | 10/1985 | Hutchinson et al. .............. 204/298 |
| 4,820,106 | * 4/1989 | Walde et al. .................... 414/217 |
| 4,984,531 | * 1/1991 | Zejda et al. .................... 204/298.28 |
| 5,135,635 | * 8/1992 | Ikeda ............................ 204/298.25 |
| 5,183,547 | * 2/1993 | Ikeda ............................ 118/730 |
| 5,259,942 | * 11/1993 | Kempf ........................... 118/730 |
| 5,538,560 | * 7/1996 | Zejda et al. .................... 204/298.23 |
| 5,660,693 | * 8/1997 | Abramson et al. ................ 204/298.23 |
| 5,716,505 | * 2/1998 | Scherer .......................... 204/298.28 |
| 5,820,329 | * 10/1998 | Derbinski et al. ................ 414/225 |

FOREIGN PATENT DOCUMENTS

| | | |
|---|---|---|
| 3716498 | 12/1988 | (DE) . |
| 4341635 | 6/1995 | (DE) . |
| 19605598 | 10/1996 | (DE) . |
| 19609249 | 8/1997 | (DE) . |

* cited by examiner

*Primary Examiner*—Nam Nguyen
*Assistant Examiner*—Gregg Cantelmo
(74) *Attorney, Agent, or Firm*—Smith, Gambrell & Russell, LLP

(57) ABSTRACT

A device for coating a disk-like substrate (3,3', . . . ) with the aid of cathodic sputtering, having an essentially cylindrical transport chamber (7) and with a vacuum pump (8) connected to the transport chamber (7) and with an opening (9) that can be closed off by a plate (16) for inserting and removing the substrates (3,3'. . . ) and with a coating chamber (11) containing the cathode (10) and with a substrate carrier (12) seated so as to be able to rotate in the transport chamber (7), the substrate carrier (12) is connected to the output shaft (13) of a motor-gear assembly unit (14) and, on the one hand, can be displaced by the latter inside the transport space (19) from a center operating position (A) in a vertical lifting motion into an upper coating position (B) and a lower rest position (C) and, on the other, can be rotated by the output shaft (13) inside the transport space (19), wherein the suction connector (15) of the vacuum pump (8) on the bottom part (4) of the transport space (19) can closed off by the substrate carrier (12) in the rest position (C).

4 Claims, 2 Drawing Sheets

SPUTTERING DEVICE FOR COATING AN ESSENTIALLY FLAT DISK-SHAPED SUBSTRATE

INTRODUCTION AND BACKGROUND

The present invention pertains to a device for coating an essentially flat, disk-like substrate with the aid of cathodic sputtering. The device comprises an essentially cylindrical transport chamber, including a round disk-shaped lid, a bottom plate extending in a plane parallel to it and an annular housing part connecting the two parts in a pressure-tight manner and a certain distance apart and forming the side wall, and with a vacuum pump connected to the transport chamber and with an opening that can be closed off by a plate provided in the lid of the transport chamber for inserting and removing the substrates and with a coating chamber connected to the lid, containing the cathode and connected by an opening in the lid to the transport space and with a substrate carrier seated so as to be able to rotate in the transport chamber.

A device for coating flat, disk-like substrates is known for U.S. Pat. No. 3,874,525 which has a coating chamber in which a two-armed gripping tool is seated so as to rotate about a vertical axis. This two-armed tool has forks at its diametrically opposing ends which can be moved in a mutually opposite sense in a vertical plane with the aid of a rack drive with a drive motor. Furthermore, two consoles are placed in the coating chamber, one of which is arranged beneath a transfer channel or coating chamber and the other on the side facing this console underneath the electron gun.

This known device has the disadvantage that the two-armed gripping tool is constructed in a comparatively elaborate manner and also does not operate very reliably, since the complicated gear drive produces wear fragments. With this device there also exists the danger that the workpiece may not be gripped properly by the fork-shaped tool and then will be either picked up in a tilted manner or come completely loose from the tool and then fall to the bottom surface of the coating chamber, which will necessarily lead to a blockage or the malfunction of the entire system. Finally, the known device requires a large overall height, which makes an undesirably large coating chamber necessary.

Also known in this art is a device shown in U.S. Pat. No. 4,548,699 in which an essentially cylindrical coating chamber is provided, consisting of a circular disk-shaped lid and bottom plate of the same type, wherein the lid and the bottom plate are solidly connected by a hollow cylindrical or annular side part. Arranged therein is a circular disk-shaped rotary plate for holding and guiding the substrates and an additional pressure plate. These can be displaced in the direction of the lid and, after the displacement, close off a transfer opening provided in the lid to thereby fit pressure-tight together with the lid. This known device has a complicated structure and operates relatively slowly, particularly since the wafers must be taken up by spring elements and the transfer opening must be closed off by an additional locking plate that pivots about a bolt arranged transverse to the axis of rotation.

Also known is a device (German Patent No. 37 16 498) for transferring an essentially flat workpiece into and out of an evacuated coating chamber formed from a flat, circular disk-shaped lid and a flat, circular disk-shaped bottom plate extending in a plane parallel to it and of an annular side part connecting both parts pressure-tight and holding them a distance apart. A circular disk-shaped rotary plate is seated in the coating chamber so as to be able to rotate for holding the workpiece during the coating process. The device serves for feeding the workpiece into and returning it from the area of a coating source arranged at the lid of the coating chamber for the purpose of treating the workpiece. A coating device arranged on the lid of the coating chamber is provided with one or more lid-shaped workpiece carriers, with the aid of which the workpieces can be brought into a position adjacent to the opening of the coating chamber. From there, the opening can be closed off from above by the workpiece carrier and from the bottom by a lifting plate that is held and guided on a rotary plate seated so as to rotate inside the coating chamber. The workpiece carrier then can be pressed against the lid of the coating chamber by a lifting cylinder supported on the coating device and the lifting plate can be similarly pressed by a lifting device mounted on the bottom plate.

Finally a vacuum coating system for vapor deposition of thin-films on substrates is known from U.S. Pat. No. 3,915,117. The system has an entrance chamber, additional chambers for treating or coating substrates and with an exit chamber, as well as a conveyance unit arranged in an evacuated main chamber for conveying the substrates through the chambers. Sealing devices are provided for temporary sealing between the aforesaid chambers and the main chamber. The conveyance unit has frames for accommodating the material to be coated that are arranged around a common axis and can be pivoted about it, wherein such a frame itself forms part of the wall of treatment chamber, namely, the entry and exit chamber and a vapor-deposition chamber in at least two treatment positions, namely, an entry and exit position and a vapor-deposition position. In at least one of these treatment positions, a movable valve plate is provided for closing off an end face of the frame forming one part of the treatment chamber.

Accordingly, it is an object of the present invention to provide a device of the type as described such that the time for changing the cathode can be reduced to a minimum.

It is a further object of the present invention that the device should be simpler in structure than those of the past and thus also more economical to produce and also more reliable in its operation.

Yet another object of the present invention is to reduce the overall space required by the device and in particular, by foregoing additional drive units in the peripheral area of the transport chamber.

SUMMARY OF THE INVENTION

The above and other objects of the present invention can be achieved by a device wherein the substrate carrier is connected to the output shaft of a motor-gear assembly unit which, on the one hand, can be displaced by the latter inside the transport space from a center operating position in a vertical lifting motion into an upper coating position and a lower rest position and, on the other, can be rotated with the output shaft inside the transport space, wherein the suction connector of the vacuum pump is arranged on the bottom part of the transport chamber and can be closed off by the substrate carrier in the rest position.

More particularly, a feature of the present invention is a device for coating an essentially flat, disk-like substrate with the aid of cathodic sputtering, comprising:

an essentially cylindrical transport chamber, including a round disk-shaped lid, a bottom plate extending in a plane parallel to said lid and an annular housing part connecting said lid and bottom plate in a pressure-tight manner in spaced apart relationship and thereby forming the side wall of the transport chamber. A vacuum pump is connected to the transport chamber, the transport chamber being provided with an opening that can be closed off by a plate provided in the lid of the transport chamber for inserting and removing the substrate. The transport chamber has a coating chamber connected to the lid, containing the cathode and is connected by an opening in the lid to the space in the transport chamber; i.e., the transport space, and with a substrate carrier seated so as to be able to rotate in the transport space. The substrate carrier in turn is connected to the output shaft of a motor-gear assembly unit. This unit permits the substrate carrier to be displaced inside the transport space from a center operating position (shown in FIG. 1 as A) in a vertical lifting motion to an upper coating position (shown in FIG. 2 as B) and a lower rest position (shown in FIG. 3 as C). The unit also permits rotation of the substrate carrier by the output shaft inside the transport space. The suction connector of the vacuum pump is arranged on the bottom part of the transport space and can be closed off by the substrate carrier in the rest position.

BRIEF DESCRIPTION OF THE DRAWINGS

The present invention permits a broad range of embodiment possibilities; one of these is illustrated further in the drawings in a purely schematic fashion; wherein.

DETAILED DESCRIPTION OF THE INVENTION

Figure 1:
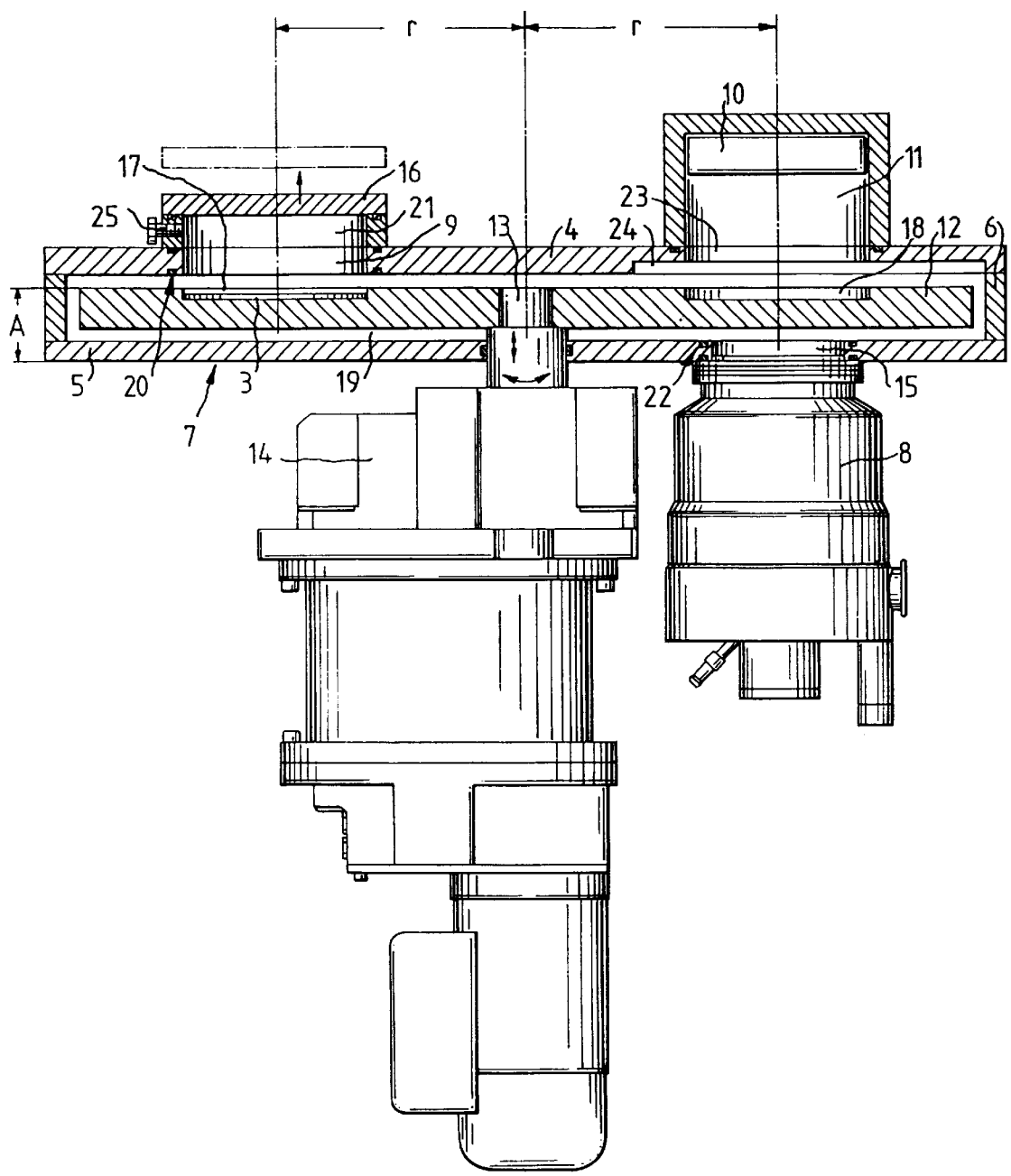
FIG. 1 is a partial sectional side view showing the substrate carrier of the invention in its middle position, i.e., transport position inside the transport chamber.

Referring to FIG. 1, the device for coating substrates 3 consists essentially of the transport chamber 7 with the substrate carrier 12 arranged in it so as to rotate and with substrate holders 17,18, the coating chamber 11 with the sputtering cathode 10 arranged in it, the closure plate 16 for closing off the transfer opening 9 in the lid 4 of the transport chamber 7, the motor-gear assembly unit 14 for the drive shaft 13, on which the substrate carrier 12 rigidly fastened, and the vacuum pump 8, whose suction connector 15 is connected to the transport space 19.

Figure 2:
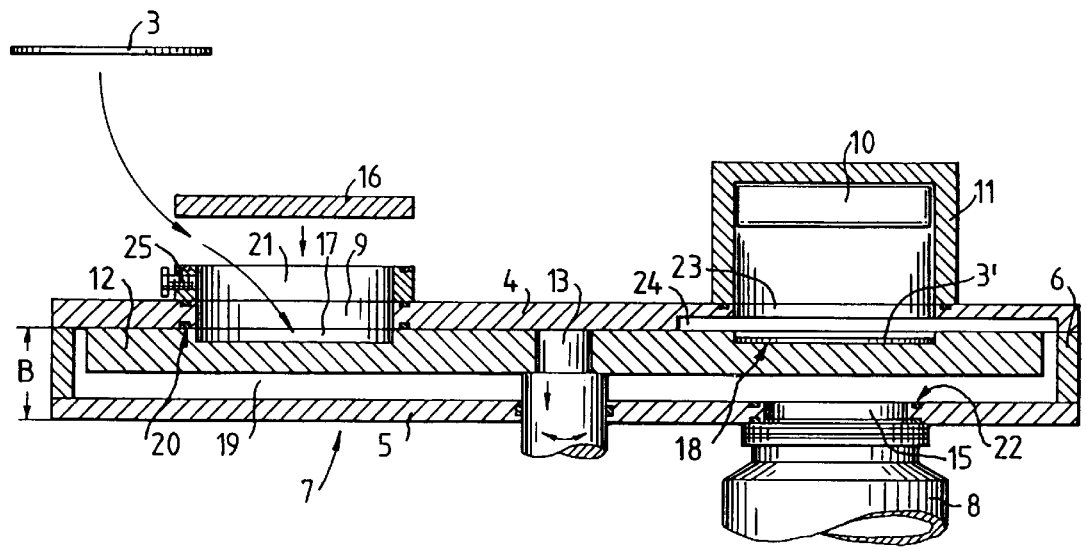
FIG. 2 is a partial sectional view of the transport chamber according to FIG. 1, but with the substrate carrier in the upper position, i.e., in the transfer and coating position.

For transferring the substrate 3 in and out and also for the coating process, the substrate carrier 12 is moved by the motor-gear assembly unit 14 into the position B shown in FIG. 2, in which the substrate carrier 12 contacts the seal 20 with its top side and thus decouples the transport space 19 from the transfer chamber 21 or closes off the opening 9 in the lid 4 of the transport chamber 7. After reaching the position B, an additional, already transferred, substrate 3', located in a substrate holder 18 directly opposite the substrate holder 17' and also positioned exactly underneath the cathode 10, can be coated.

As FIG. 2 also shows, the plate 16 is lifted off or removed from the transfer chamber 21 for the transfer in (or the transfer out) so that a substrate 3 can be transferred in (or transferred out.) After the transfer in or out, the transfer chamber 21 can again be closed off with the aid of plate 16 and the substrate carrier 12 can be lowered into the position A shown in FIG. 1 and then turned, so that the most recently transferred substrate 3' reaches the coating position.

In order to be able to change the cathode 10 or its target (which is sputtered), without the vacuum pump 8 connected to and evacuating the transport space 19 having to be turned off, the substrate carrier 12 can be lowered into the position C, wherein the bottom side of the substrate carrier 12 contacts the seal 22 and blocks off the suction connector 15, which does not cause any problems to the running vacuum pump 8.

Figure 3:
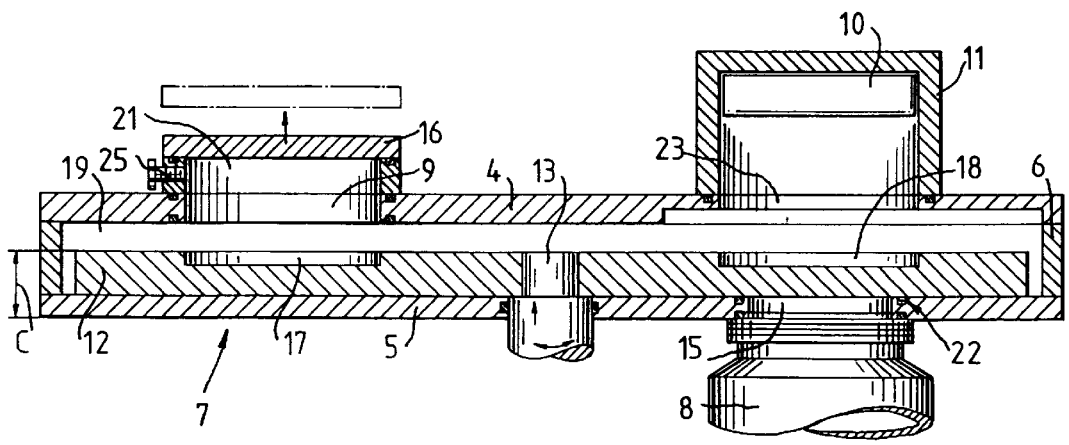
FIG. 3 is the partial sectional view of the transport chamber according to FIG. 1, but with the substrate carrier in the lower position, i.e., in the blocking or rest position.

After the lowering into position C as shown in FIG. 3, the coating chamber 11 can be removed from the transport chamber 7 or opened and the cathode 10 can be replaced by another. After the exchange of the cathode and the positioning or closing of the coating chamber 11, the substrate carrier 12 can be raised into the operating position of FIG. 1, so that the connection of the still running vacuum pump 8 to the transport space 19 is restored.

A particular advantage of the device resides in the fact that the vacuum pump 8 need not be shut off before the cathode exchange and need not be turned on again after the cathode exchange is finished—a process which requires a comparatively long time, particularly when a high-vacuum pump (turbomolecular pump) is being employed. The compact motor-gear assembly unit, which takes care of both the lifting motions and the rotational motion of the substrate carrier 12, offers another advantage.

Further variations and modifications will be apparent to those skilled in the art from a reading of the foregoing and are intended to be encompassed by the claims appended hereto.

I claim:

1. A cathodic sputtering device for coating an essentially flat, disk-like substrate with the aid of cathodic sputtering, comprising:

an essentially cylindrical transport chamber, said transport chamber including a round disk-shaped lid, a bottom plate extending in a plane parallel to said lid, and an annular housing part connecting said lid and said bottom plate in a pressure-tight manner in spaced apart relationship, said annular housing forming a side wall of the transport chamber;

a transfer opening for inserting and removing a substrate;

a rotatable substrate carrier located within said transport chamber said rotatable substrate carrier separated from said transport chamber by a transport space, wherein said rotatable substrate carrier is rotated within said transport space;

a motor-gear assembly, comprising an output shaft connected to said rotatable substrate carrier to rotate the rotatable substrate carrier within the transport space and to vertically displace the rotatable substrate carrier inside the transport space from a center operating position to an upper coating position and a lower rest position, said center operating position located intermediate to said upper coating position and said lower rest position;

a coating chamber connected to the transport space through an opening in said lid, said coating chamber containing a cathode; and a vacuum pump connected to the transport chamber, wherein said vacuum pump has a suction connector connected to a bottom portion of said transport space such that said suction connector is sealed off by said rotatable substrate carrier when said rotatable substrate carrier is in the lower rest position.

2. The device according to claim 1, wherein a transfer chamber is connected adjacent to said transfer opening and said transfer chamber is provided with a connector for a vacuum pump.

3. The device according to claim 1, wherein the opening in the lid for the coating chamber is connected via a channel forming a bypass to the transport space.

4. The device according to claim 1, wherein the coating chamber is connected so that said coating chamber can be detached from the transport chamber.

* * * * *